(12) United States Patent
Zeng et al.

(10) Patent No.: US 11,249,846 B2
(45) Date of Patent: Feb. 15, 2022

(54) ERASURE CODE-BASED DATA PROCESSING METHOD AND APPARATUS

(71) Applicant: Huawei Technologies Co., Ltd., Shenzhen (CN)

(72) Inventors: Yanxing Zeng, Hangzhou (CN); Liang Chen, Hangzhou (CN); Ruliang Dong, Hangzhou (CN); Jinyi Zhang, Hangzhou (CN); Kebo Fu, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/910,924

(22) Filed: Jun. 24, 2020

(65) Prior Publication Data
US 2020/0401480 A1    Dec. 24, 2020

(30) Foreign Application Priority Data

Jun. 24, 2019  (CN) .......................... 201910551394.2
Nov. 18, 2019  (CN) .......................... 201911128710.1

(51) Int. Cl.
*G06F 11/00* (2006.01)
*G06F 11/10* (2006.01)
*H03M 13/15* (2006.01)
*H03M 13/00* (2006.01)

(52) U.S. Cl.
CPC ....... *G06F 11/1068* (2013.01); *H03M 13/154* (2013.01); *H03M 13/616* (2013.01)

(58) Field of Classification Search
None
See application file for complete search history.

(56) References Cited

U.S. PATENT DOCUMENTS

| 7,203,892 | B2 | 4/2007 | Corbett et al. |
| 10,289,488 | B1 | 5/2019 | Danilov et al. |
| 10,944,429 | B1* | 3/2021 | Yang ................. H03M 13/1575 |
| 2003/0196023 | A1* | 10/2003 | Dickson ............. G06F 11/1076 |
| | | | 711/1 |

(Continued)

FOREIGN PATENT DOCUMENTS

| CN | 104850468 A | 8/2015 |
| CN | 106662983 A | 5/2017 |

(Continued)

OTHER PUBLICATIONS

Y. Wei, Y. W. Foo, K. C. Lim and F. Chen, "The Auto-configurable LDPC Codes for Distributed Storage," 2014 IEEE 17th International Conference on Computational Science and Engineering, 2014, pp. 1332-1338, doi: 10.1109/CSE.2014.254. (Year: 2014).*

(Continued)

*Primary Examiner* — Daniel F. McMahon
(74) *Attorney, Agent, or Firm* — Conley Rose, P.C.

(57) ABSTRACT

An erasure code (EC)-based data processing method implemented by a storage controller includes obtaining K data chunks, dividing each of the K data chunks into two data slices, encoding the 2*K data slices based on a parity matrix including 2*M rows and 2*(K+M) columns of elements, to obtain 2*M parity slices, and separately storing the K data chunks and the M parity chunks in different storage devices.

20 Claims, 8 Drawing Sheets

(56) References Cited

U.S. PATENT DOCUMENTS

| | | | | |
|---|---|---|---|---|
| 2006/0218470 A1* | 9/2006 | Dickson | ............ | H03M 13/1515 |
| | | | | 714/767 |
| 2008/0222480 A1* | 9/2008 | Huang | ............... | H03M 13/1191 |
| | | | | 714/752 |
| 2013/0151926 A1* | 6/2013 | Leggette | ............. | G06F 11/1092 |
| | | | | 714/763 |
| 2014/0040417 A1* | 2/2014 | Gladwin | ................. | G06F 3/064 |
| | | | | 709/214 |
| 2016/0253240 A1* | 9/2016 | Cocagne | ............... | G06F 3/0619 |
| | | | | 714/764 |

FOREIGN PATENT DOCUMENTS

| | | |
|---|---|---|
| CN | 109213420 A | 1/2019 |
| EP | 3364541 A1 | 8/2018 |
| WO | 2016126202 A1 | 8/2016 |
| WO | 2019076912 A1 | 4/2019 |

OTHER PUBLICATIONS

Xiang, L., et al., "Optimal recovery of single disk failure in RDP code storage systems," SIGMETRICS 2010, 12 pages.
EMC, XtremIO white paper, "XtremIO data protection(XDP)," Jul. 2014, 25 pages.
XP055538497 James S. Plank,"The RAID-6 Liberation Codes", 6th USENIX Conference on File and Storage Technologies, FAST 2008, Feb. 26-29, 2008, San Jose, CA, USA, 14 pages.
XP058064815 K. V. Rashmi et al.,"A "Hitchhiker's" Guide to Fast and Efficient Data Reconstruction in Erasure-coded Data Centers", SIGCOMM'14, Aug. 17-22, 2014, Chicago, USA, 12 pages.

\* cited by examiner

| Data chunk $D_1$ | Data chunk $D_2$ | Data chunk $D_j$ | Data chunk $D_{k-1}$ | Data chunk $D_k$ | Parity chunk $P_1$ | Parity chunk $P_h$ | Parity chunk $P_M$ |
|---|---|---|---|---|---|---|---|
| $D_{10}$ $D_{11}$ | $D_{20}$ $D_{21}$ | $D_{j0}$ $D_{j1}$ | $D_{(k-1)0}$ $D_{(k-1)1}$ | $D_{K0}$ $D_{K1}$ | $P_{10}$ $P_{11}$ | $P_{h0}$ $P_{h1}$ | $P_{M0}$ $P_{M1}$ |
| Element ⋮ | ⋮ ⋮ | ⋮ ⋮ | ⋮ ⋮ | ⋮ ⋮ | ⋮ ⋮ | ⋮ ⋮ | Element ⋮ |
| Element ⋮ | ⋮ ⋮ | ⋮ ⋮ | ⋮ ⋮ | ⋮ ⋮ | ⋮ ⋮ | ⋮ ⋮ | Element ⋮ |
| Element ⋮ | ⋮ ⋮ | ⋮ ⋮ | ⋮ ⋮ | ⋮ ⋮ | ⋮ ⋮ | ⋮ ⋮ | Element ⋮ |
| ⋮ ⋮ | ⋮ ⋮ | ⋮ ⋮ | ⋮ ⋮ | ⋮ ⋮ | ⋮ ⋮ | ⋮ ⋮ | ⋮ ⋮ |
| Element ⋮ | ⋮ ⋮ | ⋮ ⋮ | ⋮ ⋮ | ⋮ ⋮ | ⋮ ⋮ | ⋮ ⋮ | Element ⋮ |

2*(K+M) columns

2*M rows

FIG. 4

| Data chunk $D_1$ | | Data chunk $D_2$ | | Data chunk $D_3$ | | Data chunk $D_4$ | | Parity chunk $P$ | | Parity chunk $Q$ | | Parity chunk $R$ | |
|---|---|---|---|---|---|---|---|---|---|---|---|---|---|
| $D_{10}$ | $D_{11}$ | $D_{20}$ | $D_{21}$ | $D_{30}$ | $D_{31}$ | $D_{40}$ | $D_{41}$ | $P_0$ | $P_1$ | $Q_0$ | $Q_1$ | $R_0$ | $R_1$ |
| 1 | 0 | 1 | 0 | 1 | 0 | 1 | 0 | 1 | 0 | 0 | 0 | 0 | 0 |
| 0 | 1 | 0 | 1 | 0 | 1 | 0 | 1 | 0 | 1 | 0 | 0 | 0 | 0 |
| 1 | 0 | $\alpha$ | 0 | $\alpha^2$ | 1 | $\alpha^3$ | 0 | 0 | 0 | 1 | 0 | 0 | 0 |
| 0 | 1 | 0 | $\alpha$ | 0 | $\alpha^2$ | 1 | $\alpha^3$ | 0 | 0 | 0 | 1 | 0 | 0 |
| 1 | 1 | $\alpha^2$ | 0 | $\alpha^4$ | 0 | $\alpha^8$ | 0 | 0 | 0 | 0 | 0 | 1 | 0 |
| 0 | 1 | 1 | $\alpha^2$ | 0 | $\alpha^4$ | 0 | $\alpha^8$ | 0 | 0 | 0 | 0 | 0 | 1 |

ERASURE CODE-BASED DATA PROCESSING METHOD AND APPARATUS

CROSS-REFERENCE TO RELATED APPLICATIONS

This application claims priority to Chinese Patent Application No. 201911128710.1 filed on Nov. 18, 2019 and Chinese Patent Application No. 201910551394.2 filed on Jun. 24, 2019, both of which are hereby incorporated by reference in their entireties.

TECHNICAL FIELD

This application relates to the field of storage technologies, and in particular, to an erasure code (EC)-based data processing method and a storage controller that performs the data processing method.

BACKGROUND

An EC is a technical branch of classical error correction code. A core of the EC is to encode a data chunk to obtain a parity chunk. The data chunk and the parity chunk together form a chunk group. For example, assuming that there are K data chunks and M parity chunks, a length of a chunk group obtained after EC encoding is K+M. Correspondingly, in a storage system, the K data chunks and the M parity chunks are separately stored in different hard disks (or storage devices of other types) such that a storage system having a fault tolerance capability is formed. K+M is referred to as an EC configuration manner, and the EC usually includes a conventional Reed-Solomon code (RS).

The conventional RS code is used as an example. For an RS code with a K+M configuration, when an error occurs in data in any hard disk, data in another hard disk needs to be read to reconstruct (restore) the data in the hard disk.

However, as a hard disk capacity becomes larger, when a hard disk is faulty, a data read volume required for reconstructing data stored in the hard disk increases, and a time required for reconstructing the data stored in the hard disk also increases, thereby affecting working efficiency of the storage system.

SUMMARY

This application provides an EC-based data processing method. A reconstruction process of a storage controller using the method occupies relatively fewer computing resources.

A first aspect provides an EC-based data processing method. The method includes obtaining, by a storage controller, K data chunks, where K is a positive integer. Then, the storage controller divides each data chunk into two data slices, to obtain 2*K data slices. The storage controller encodes the 2*K data slices based on a parity matrix, to obtain 2*M parity slices, where the 2*M parity slices form M parity chunks, and M is a positive integer. The K data chunks and the M parity chunks form a chunk group. Finally, the storage controller stores the K data chunks and the M parity chunks in a plurality of storage devices. The K+M chunks may be stored in K+M different storage devices, and each storage device stores one chunk.

The foregoing used parity matrix includes 2*M rows and 2*(K+M) columns of elements, and each column of elements correspond to one data slice or one parity slice. Each of the first column to the 2*K$^{th}$ column corresponds to one data slice, and each of the (2*K+1)$^{th}$ column to the 2*(K+M)$^{th}$ column corresponds to one parity slice. Each row of elements in the parity matrix correspond to one exclusive OR (XOR) equation, and the XOR equation corresponding to each row of elements is used to obtain one parity slice based on some of the 2*K data slices. Further, data slices used to obtain a parity slice are determined based on a non-zero element of the row corresponding to the XOR equation. When a chunk group constructed using the encoding method provided in this application subsequently reconstructs a damaged chunk, the storage controller needs to execute fewer input/output (IO) requests, a reconstruction process occupies fewer computing resources of the storage controller, and other services run on the storage controller are less affected.

With reference to the first aspect, the parity matrix is preset in the storage controller, and the parity matrix meets at least one setting rule.

With reference to the first aspect, in some implementations of the first aspect, the at least one setting rule includes that an element in the parity matrix is 0, 1, or an element in a finite field.

With reference to the first aspect, in some implementations of the first aspect, the at least one setting rule includes that two columns that are in the parity matrix and that correspond to two data slices included in any data chunk or two parity slices included in any parity chunk form a first submatrix including 2*M rows and two columns of elements, where at least one of 2*2 matrices formed by any two even-numbered rows or any two odd-numbered rows of the first submatrix is full rank.

With reference to the first aspect, in some implementations of the first aspect, the at least one setting rule includes that 2*r columns that are in the parity matrix and that correspond to 2*r slices included in any r chunks form a second submatrix including 2*M rows and 2*r columns of elements, where a rank of the second submatrix is 2r, and r is an integer less than or equal to M.

The at least one setting rule may include any one or a combination of any two or more of the foregoing implementations.

With reference to the first aspect, in some implementations of the first aspect, the method further includes determining, by the storage controller, that r chunks in the K data chunks and the M parity chunks are damaged, and reconstructing, by the storage controller, the r damaged chunks based on XOR equations corresponding to a plurality of rows of elements in the parity matrix, and storing the r damaged chunks in undamaged storage devices, where r is an integer less than or equal to M. When the storage controller determines that more than M chunks in the K data chunks and the M parity chunks are damaged, the storage controller cannot reconstruct the damaged chunks.

A second aspect provides a storage controller. The storage controller includes a communications module and a processing module. The communications module is configured to obtain K data chunks, where K is a positive integer, the processing module is configured to divide each data chunk into two data slices, to obtain 2*K data slices, and encode the 2*K data slices based on a parity matrix, to obtain 2*M parity slices, where the 2*M parity slices form M parity chunks, and M is a positive integer, and the parity matrix includes 2*M rows and 2*(K+M) columns of elements, each column of elements correspond to one data slice or one parity slice, each row of elements correspond to one XOR equation, and the XOR equation corresponding to each row of elements is used to obtain one parity slice based on some of the 2*K data slices, and the communications module is further configured to store the K data chunks and the M parity chunks in a plurality of storage devices.

With reference to the second aspect, the parity matrix is preset in the storage controller, and the parity matrix meets at least one setting rule.

With reference to the second aspect, in some implementations of the second aspect, the at least one setting rule includes that an element in the parity matrix is 0, 1, or an element in a finite field.

With reference to the second aspect, in some implementations of the second aspect, the at least one setting rule includes that two columns that are in the parity matrix and that correspond to two data slices included in any data chunk or two parity slices included in any parity chunk form a first submatrix including 2*M rows and two columns of elements, where at least one of 2*2 matrices formed by any two even-numbered rows or any two odd-numbered rows of the first submatrix is full rank.

With reference to the second aspect, in some implementations of the second aspect, the at least one setting rule includes that 2*r columns that are in the parity matrix and that correspond to 2*r slices included in any r chunks form a second submatrix including 2*M rows and 2*r columns of elements, where a rank of the second submatrix is 2r, and r is an integer less than or equal to M.

With reference to the second aspect, in some implementations of the second aspect, the processing module is further configured to determine that r chunks in the K data chunks and the M parity chunks are damaged, and reconstruct the r damaged chunks based on XOR equations corresponding to a plurality of rows of elements in the parity matrix.

A third aspect provides another storage controller. The other storage controller includes a processor and a memory. The processor is configured to execute a program in the memory to perform the method provided in the first aspect and any one of the implementations of the first aspect.

A fourth aspect provides another storage controller. The other storage controller includes a processor, a memory, and a data processing chip. The data processing chip cooperates with the processor that executes a program in the memory to perform the method provided in the first aspect and any one of the implementations of the first aspect.

A fifth aspect provides a storage system. The storage system includes a plurality of storage devices and at least one storage controller provided in the second aspect and any one of the implementations of the second aspect, or at least one storage controller provided in the third aspect, or at least one storage controller provided in the fourth aspect.

A sixth aspect provides a non-transient readable storage medium. When an instruction stored in the non-transient readable storage medium is executed by a storage controller, the storage controller performs the method provided in the first aspect and any one of the implementations of the first aspect. The storage medium stores a program instruction. The storage medium includes but is not limited to a volatile memory, for example, a random-access memory (RAM), and a non-volatile memory, for example, a read-only memory (ROM).

A seventh aspect provides a computer program product. When an instruction included in the computer program product is executed by a storage controller, the storage controller performs the method provided in the first aspect and any one of the implementations of the first aspect. The computer program product may be a software installation package. When the method provided in the first aspect and any one of the implementations of the first aspect needs to be used, the computer program product may be downloaded, and the instruction included in the computer program product is executed in the storage controller.

DESCRIPTION OF EMBODIMENTS

The following describes technical solutions of embodiments in this application with reference to accompanying drawings.

Ordinal numbers such as "1", "2", "3", "first", "second", and "third" in this application are used to distinguish between a plurality of objects, but are not used to limit a sequence of the plurality of objects.

Throughout this specification, a finite field is also referred to as a Galois field, and is denoted as GF ($\alpha^w$). A finite field GF ($\alpha^w$) includes $\alpha^w$ elements, where $\alpha$ is a prime number, and w is a positive integer. Addition and multiplication between the $\alpha^w$ elements are closed, that is, a result of addition between any two elements in the $\alpha^w$ elements is still one of the $\alpha^w$ elements, and a result obtained by multiplying any two elements in the $\alpha^w$ elements is still one of the $\alpha^w$ elements. The addition or multiplication in this application refers to an operation in the Galois field. Generally, addition or multiplication in the Galois field is obtained by looking up an operation table of the Galois field. The operation table of the Galois field is stored in a storage controller.

Throughout this specification, an XOR operation between two slices means that an XOR operation is sequentially performed on each bit of data of the two slices. For example, an XOR operation is performed on the first bit of a slice 1 and the first bit of a slice 2, to obtain the first bit of a slice 3, and so on, until the XOR operation is performed on the last bit of the slice 1 and the last bit of the slice 2, to obtain the last bit of the slice 3. In this case, the slice 3 is obtained by performing the XOR operation on the slice 1 and the slice 2. In this specification, the symbol "⊕" is an operator of the XOR operation.

Throughout this specification, the symbol "*" is an operator of a multiplication operation. When neither of multipliers on both sides of "*" is an element of the Galois field, "*" represents a multiplication operation in the four arithmetic operations. When one of the multipliers on both sides of "*" is an element in the Galois field, the "*" represents a multiplication operation in the Galois field.

Throughout this specification, reconstruction overheads are a parameter used to measure, when any one of K+M storage devices storing data of a chunk group is damaged, access overheads that are of the storage device and that are required for restoring the damaged storage device. The reconstruction overheads are equal to a ratio of a size of a data slice read from an undamaged storage device to a size of all data slices in the chunk group when the damaged storage device is restored, or are equal to a ratio of a quantity of slices read from an undamaged storage device to a quantity of all data slices in the chunk group when the damaged storage device is restored. Therefore, when a storage device is damaged, smaller reconstruction overheads indicate a shorter time required for restoring data stored in the damaged storage device. A definition of the chunk group is described in detail in the following.

Figure 1:
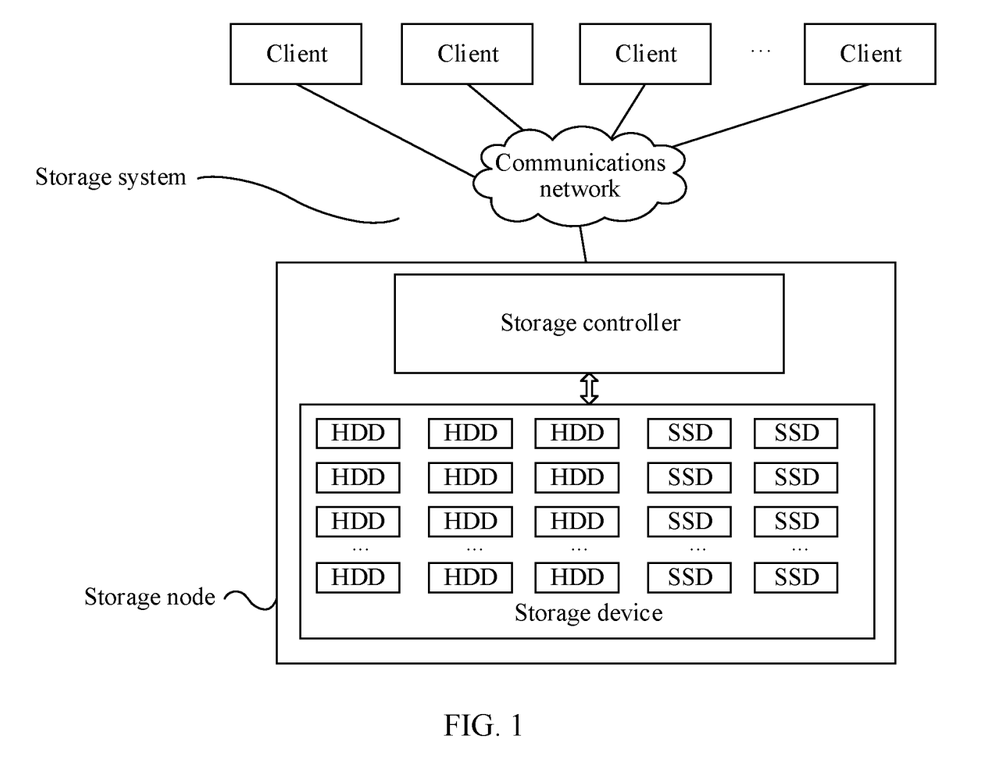
FIG. 1 is a schematic diagram of an organizational structure of a storage system according to an embodiment of this application.
Figure 2:
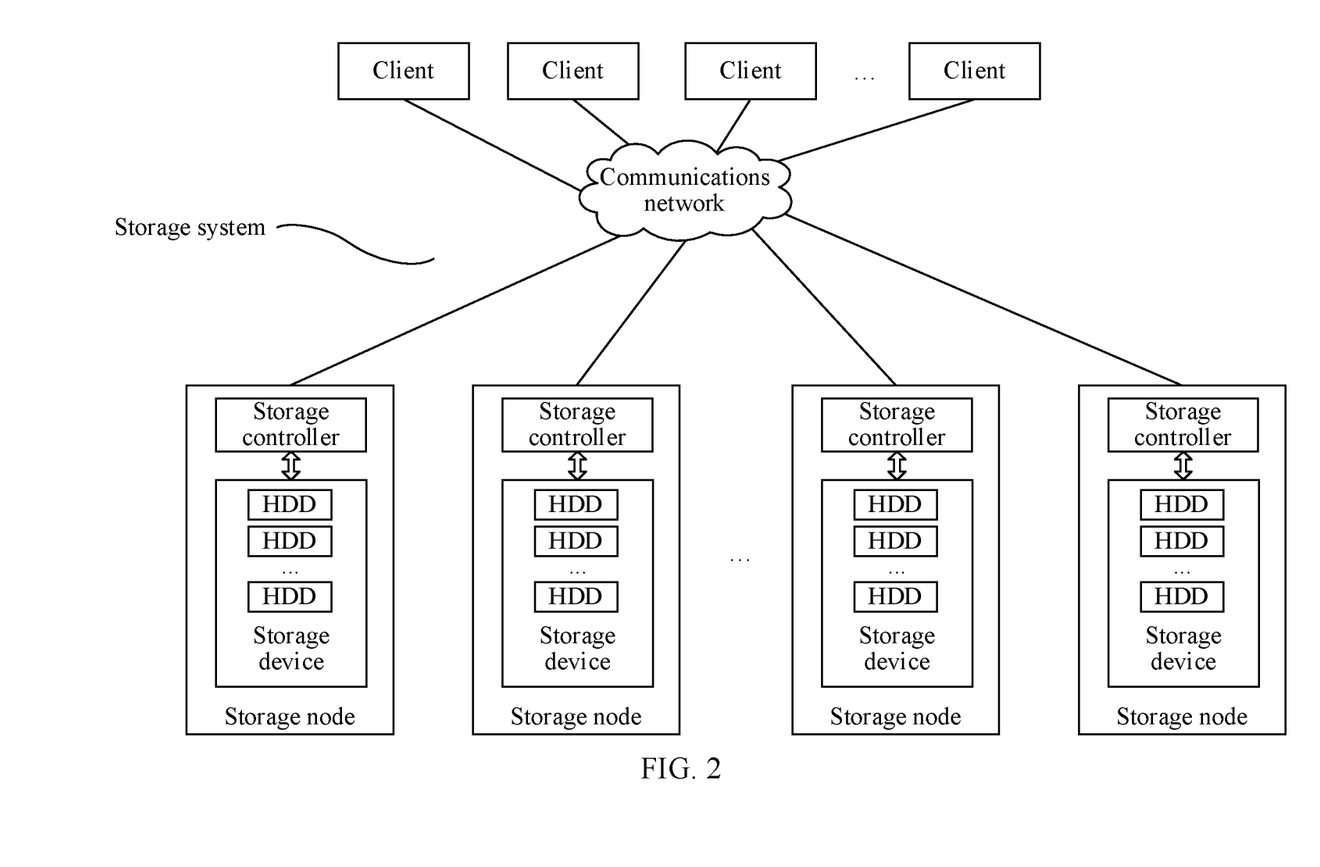
FIG. 2 is a schematic diagram of an organizational structure of another storage system according to an embodiment of this application.

Architecture to which the embodiments of this application are applied:

FIG. 1 and FIG. 2 show two storage systems with different architectures. The storage system in FIG. 1 includes a storage node and at least one client. The client and the storage node are connected using a communications network (for example, ETHERNET or INFINIBAND). The storage node is provided with a storage controller and a plurality of storage devices, and the storage node may actually be a storage array, for example, Huawei® Oceanstor® 18000 series and Dorado® V3 series. FIG. 2 shows a distributed storage system. The storage system includes at least one client and a plurality of storage nodes, and each storage node may be actually a server. The client and the storage nodes are connected using a communications network (for example, ETHERNET or INFINIBAND). At least one storage node in the storage system includes a storage controller, each storage node includes a storage device, and all the storage nodes establish communication connection to each other using the communications network. The storage devices in FIG. 1 and FIG. 2 may be hard disk drives (HDD), solid state drives (SSD), or storage disks of other types.

The storage controller in the storage node in FIG. 1 processes to-be-written data sent by the client to a storage array in which the storage controller is located. Each storage controller in FIG. 2 may receive to-be-written data sent by the client, and perform EC-based encoding and reconstruction on the to-be-written data. A slice obtained after a storage controller performs encoding may not only be stored in a storage device of a storage node in which the storage controller is located, but also may be sent to a storage device of another storage node using the communications network, to implement distributed storage. Because a plurality of storage controllers may concurrently work in the distributed storage system, each storage controller in the plurality of storage controllers is responsible for one storage node group in the storage system, and each storage node group includes at least one storage node. A storage controller in a storage node group is responsible for receiving to-be-written data sent by the client, encoding the to-be-written data, and storing an obtained data slice and parity slice into a storage node in the storage node group. The storage controller in the following may refer to any storage controller in FIG. 1 or FIG. 2, and the storage controller is configured to perform EC-based encoding and reconstruction.

Figure 3:
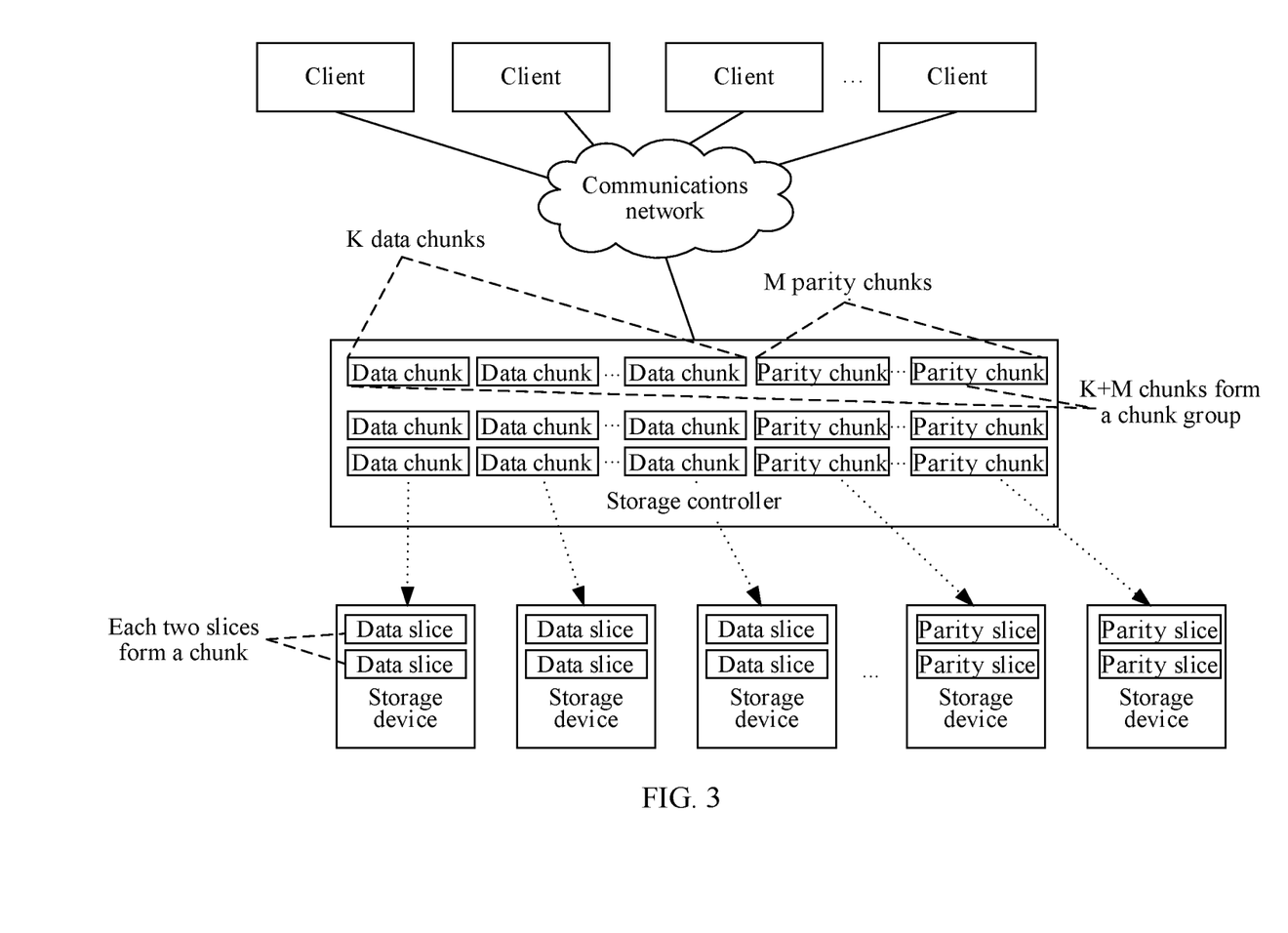
FIG. 3 is a schematic diagram of an organizational structure of another storage system according to an embodiment of this application.

As shown in FIG. 3, in a running process of a storage system, a storage controller continuously receives to-be-written data sent by a client. After receiving a preset quantity of to-be-written data, the storage controller divides the preset quantity of to-be-written data into K to-be-encoded data chunks. Each data chunk is divided into two data slices, and 2*M parity slices are generated based on the 2*K data slices and an EC-based encoding method. The 2*M parity slices form M parity chunks. Every K data chunks and M parity chunks that are generated using the K data chunks form a chunk group. A size of each chunk may be set based on requirements, for example, the size is 512 byte, 4 k byte, 8 k byte, or 32 k byte. Generally, K and M are encoding configuration parameters set by a user. To meet different requirements of the user, the storage controller has an EC-based encoding and reconstruction method for different K and M configurations.

After a chunk group is generated, the storage controller stores each chunk in the chunk group into a storage device. After storing each chunk in a chunk group in a corresponding storage device, the storage controller continues to form another chunk group using to-be-written data sent by the client, and processes the other chunk group in the foregoing manner.

Each chunk is divided into two slices in a storage device for storage. In FIG. 3, a slice corresponding to a data chunk is referred to as a data slice, and a slice corresponding to a parity chunk is referred to as a parity slice. Although the two slices of each chunk are stored in a same storage device, storage addresses (physical storage addresses or logical storage addresses) of the two slices may be discontinuous or discontinuous. Generally, sizes of slices in a chunk group are the same.

If any storage device is damaged, data of other chunks in a chunk group to which a chunk on the damaged storage device belongs needs to be used to restore the chunk on the damaged storage device. A reconstruction method based on an EC needs to be used in the restoration process.

Each parity slice is obtained by performing an XOR operation on a plurality of data slices. A process of obtaining a parity slice by performing an XOR operation on data slices is also referred to as an encoding process of the data slices. In a process of generating the parity slice, the storage controller determines, using a parity matrix preset in the storage controller, data slices that are encoded to obtain each of the 2*M parity slices.

Due to a feature of the XOR operation, it is assumed that a parity slice and data slices used to generate the parity slice have a total of L slices, and one remaining slice may be obtained by performing the XOR operation on any L−1 slices in the L slices. Therefore, when any storage device is damaged, the storage controller may also learn, using the parity matrix, storage devices in which stored slices can be used to reconstruct each slice stored in the damaged storage device. In a reconstruction process, the storage controller needs to read each slice required for reconstruction from the storage device to the storage controller. In this process, an IO request for reading data is generated. Therefore, in the reconstruction process, a smaller size (that is, smaller reconstruction overheads) of a slice that needs to be read by the storage controller indicates a higher speed of reconstructing a damaged data slice. In the reconstruction process, fewer slices that need to be read by the storage controller indicate fewer IO requests that need to be processed by the storage controller, and a higher speed of reconstructing a damaged data slice. In addition, fewer computing resources occupied by the storage controller in the reconstruction process indicate smaller impact on other services run on the storage controller.

The following describes the parity matrix used in this application using an example in which one chunk group includes K data chunks (a data chunk $D_1$ to a data chunk $D_K$) and M parity chunks (a parity chunk $P_1$ to a parity chunk $P_K$).

Figure 4:
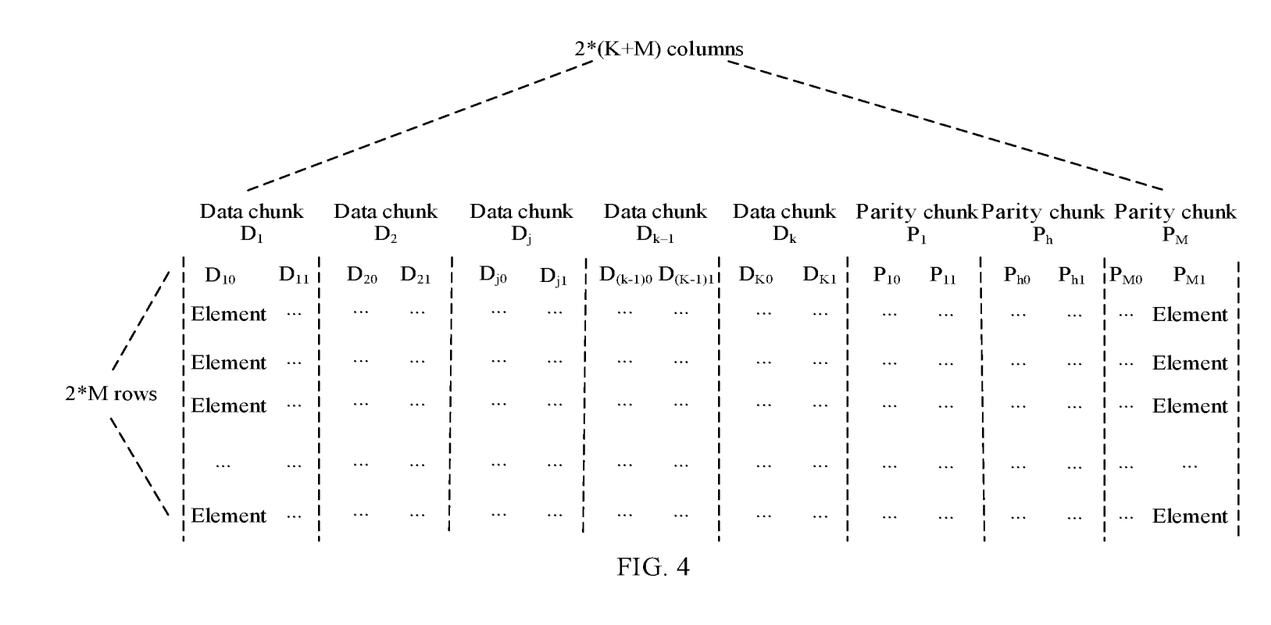
FIG. 4 is a schematic structural diagram of a parity matrix according to an embodiment of this application.

The parity matrix is preset in the storage controller, and may be further stored in a memory or a data processing chip of the storage controller. A setting of the parity matrix meets at least one setting rule. Details are described below. As shown in FIG. 4, a quantity of rows of the parity matrix is 2*M, and a quantity of columns of the parity matrix is 2*(K+M). Each column of the parity matrix corresponds to one data slice or one parity slice. FIG. 4 is used as an example. The first column of the parity matrix corresponds to a data slice $D_{10}$, the second column corresponds to a data slice $D_{11}$, and the data slice $D_{10}$ and the data slice $D_{11}$ belong to the data chunk $D_1$. The $(2j+1)^{th}$ column of the parity matrix corresponds to a data slice $D_{j0}$, and the $(2j+2)^{th}$ column corresponds to a data slice $D_{j1}$. The data slice $D_{j0}$ and the data slice $D_{j1}$ belong to a data chunk $D_j$, and j is an integer greater than 1 and less than K. The $(2*K+1)^{th}$ column of the parity matrix corresponds to a parity slice $P_{10}$, the $(2*K+2)^{th}$ column corresponds to a parity slice $P_{11}$, and the parity slice $P_{10}$ and the parity slice $P_{11}$ belong to the parity chunk $P_1$. The $(2K+2*h+1)^{th}$ column of the parity matrix corresponds to a parity slice $P_{h0}$, and the $(2K+2*h+2)^{th}$ column corresponds to a parity slice $P_{h1}$. The parity slice $P_{h0}$ and the parity slice $P_{h1}$ belong to a parity chunk $P_h$, and h is an integer greater than 1 and less than M.

The parity matrix includes 2*M*2*(K+M) elements. An element in the parity matrix is 0, 1, or an element in a finite field GF ($\alpha^w$). Each row of the parity matrix corresponds to one XOR equation. In each row of the parity matrix, data slices/parity slices corresponding to columns in which elements are not 0 participate in a same XOR equation.

In a chunk group obtained by encoding using the parity matrix, a maximum of r chunks may be damaged. When r is greater than M, the damaged chunk cannot be reconstructed using the parity matrix. 2*r columns that are in the parity matrix and that correspond to any r chunks form a submatrix of 2*M rows and 2*r columns, and a rank of the submatrix is 2r.

Two columns that are in the parity matrix and that correspond to any chunk form a submatrix of 2*M rows and two columns. In 2*2 matrices formed by any two even-numbered rows of the submatrix, or in 2*2 matrices formed by any two odd-numbered rows, there is at least one full-rank 2*2 matrix. A total quantity of 2*2 matrices formed by any two even-numbered rows of the submatrix of 2*M rows and two columns is C(M, 2), and a total quantity of 2*2 matrices formed by any two odd-numbered rows of the submatrix of 2*M rows and two columns is C(M, 2), where c is a combination operator (combination calculator). A total quantity of the 2*2 matrices formed by any two even-numbered rows of the submatrix of 2*M rows and two columns and the 2*2 matrices formed by any two odd-numbered rows of the submatrix of 2*M rows and two columns is 2*C(M, 2), where the 2*C(M, 2) 2*2 matrices include at least one full-rank 2*2 matrix.

A setting rule that the parity matrix provided in this application meets may include any one of the foregoing setting rules or a combination of any two or more of the foregoing setting rules.

The following uses a case in which K=4 and M=3 as an example to describe a parity matrix that meets the foregoing setting rules. Four data chunks are denoted as $D_1$, $D_2$, $D_3$, and $D_4$, and three parity chunks are denoted as P, Q, and R.

Figure 5:
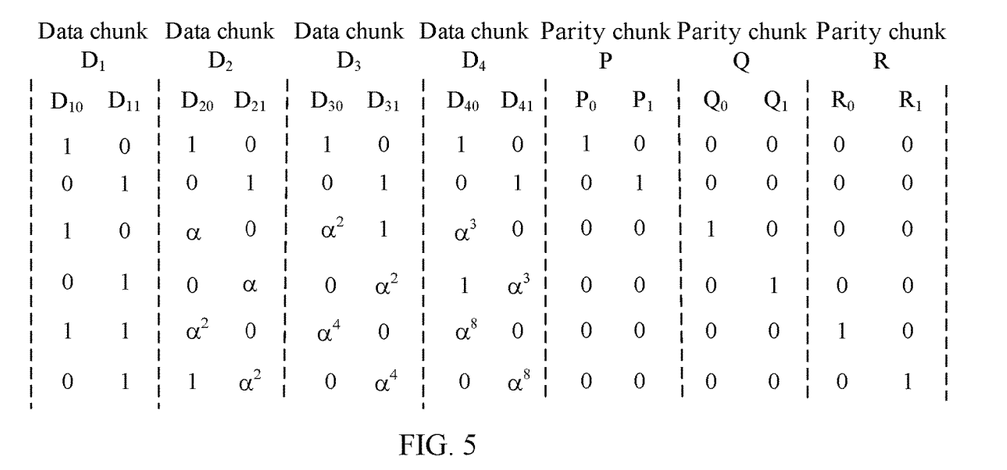
FIG. 5 is an example of a parity matrix according to an embodiment of this application.

As shown in FIG. 5, the parity matrix provided in this application includes 2*(K+M) columns and 2*M rows. The first column and the second column of the parity matrix respectively correspond to two data slices $D_{10}$ and $D_{11}$ of the data chunk $D_1$, and the third column and the fourth column of the parity matrix respectively correspond to two data slices $D_{20}$ and $D_{21}$ of the data chunk $D_2$. By analogy, the $(2k-1)^{th}$ column and the $2k^{th}$ column of the parity matrix respectively correspond to two slices $D_{k0}$ and $D_{k1}$ of a data chunk $D_k$, where a value range of k is [1, K]. Similarly, the ninth column and the tenth column of the parity matrix respectively correspond to two parity slices $P_0$ and $P_1$ of the parity chunk P, and the eleventh column and the twelfth column of the parity matrix respectively correspond to two parity slices $Q_0$ and $Q_1$ of the parity chunk Q. By analogy, the $(2*K+2*m-1)^{th}$ column and the $(2*K+2*m)^{th}$ column of the parity matrix separately correspond to two slices of one parity chunk, where $\alpha$ value range of m is [1, M].

Each row of the parity matrix corresponds to one XOR equation, and each XOR equation of the 2*M XOR equations is used to encode one parity slice. The parity matrix provided in FIG. 4 is used as an example. Six rows of the parity matrix are separately used to encode six parity slices of parity chunks P, Q, and R. The six parity slices are:

$$D_{10} \oplus D_{20} \oplus D_{30} \oplus D_{40} = P_0 \quad (1)$$

$$D_{11} \oplus D_{21} \oplus D_{31} \oplus D_{41} = P_1 \quad (2)$$

$$D_{10} \oplus \alpha^1 * D_{20} \oplus \alpha^2 * D_{30} \oplus D_{31} \oplus \alpha^3 * D_{40} = Q_0 \quad (3)$$

$$D_{11} \oplus \alpha^1 * D_{21} \oplus \alpha^2 * D_{31} \oplus D_{40} \oplus \alpha^3 * D_{41} = Q_1 \quad (4)$$

$$D_{10} \oplus D_{11} \oplus \alpha^2 * D_{20} \alpha^4 * D_{30} \oplus \alpha * D_{40} = R_0 \quad (5)$$

$$D_{11} \oplus D_{20} \oplus \alpha^2 * D_{21} \oplus \alpha^4 * D_{31} \oplus \alpha^8 * D_{41} = R_1 \quad (6)$$

The parity matrix provided in FIG. 5 is used as an example. Each parity slice participates in only one XOR equation (only one element in a column corresponding to each parity slice is 1). Therefore, each parity slice can be obtained only using an XOR equation in which the parity slice participates. In an encoding phase, after obtaining the data chunks $D_1$, $D_2$, $D_3$, and $D_4$, the storage controller obtains the six parity slices of the parity chunks P, Q, and R by encoding according to formulas (1) to (6). Then, the data chunks and the parity chunks are separately stored into different storage devices.

Each data slice participates in a plurality of XOR equations. For example, the data slice $D_{10}$ participates in XOR equations corresponding to the first row, the third row, and the fifth row of the parity matrix. Similarly, using the data slice $D_{11}$ as an example, the data slice $D_{11}$ participates in XOR equations corresponding to the second row, the fourth row, the fifth row, and the sixth row of the parity matrix. When the data chunk $D_1$ is damaged, the data slice $D_{10}$ may be restored using any one of the three XOR equations corresponding to the first row, the third row, and the fifth row of the parity matrix, and the data slice $D_{11}$ is restored using any one of the four XOR equations corresponding to the second row, the fourth row, the fifth row, and the sixth row of the parity matrix.

For example, XOR equations corresponding to the first row and the fifth row of the parity matrix are used to respectively restore the data slice $D_{10}$ and the data slice $D_{11}$. Because the data slices $D_{10}$, $D_{20}$, $D_{30}$, and $D_{40}$ are multiplexed in the two XOR equations, reconstruction overheads are $5/8=0.625$. The reconstruction overheads are small, and a speed of reconstructing the damaged data slice is high. In addition, because only five data slices $D_{10}$, $D_{11}$, $D_{20}$, $D_{30}$, and $D_{40}$ in total need to be read from the storage device, the storage controller needs to initiate only five IO requests, and the speed of reconstructing the damaged data slice is higher. In addition, fewer computing resources occupied by the storage controller in the reconstruction process indicate smaller impact on other services run on the storage controller.

Figure 6:
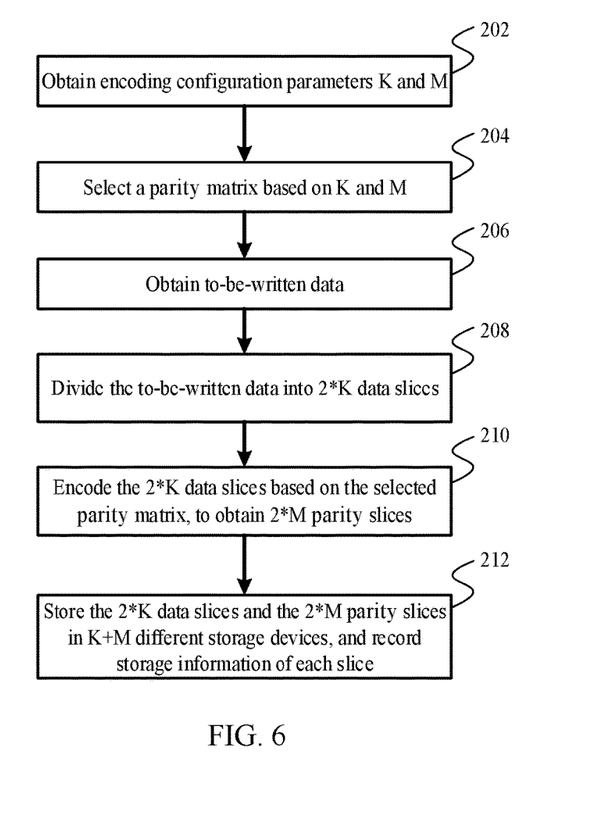
FIG. 6 is a schematic flowchart of an encoding method according to an embodiment of this application.

The following describes, using FIG. 6, an encoding method performed by a storage controller based on a parity matrix provided in this application.

Step 202: The storage controller obtains encoding configuration parameters K and M. As described above, K and M are generally set by a user.

Step 204: Select a parity matrix based on K and M. The storage controller stores parity matrices corresponding to different encoding configuration parameters, and selects a corresponding parity matrix based on K and M obtained in step 202 for a subsequent encoding process.

Step 206: The storage controller continuously receives to-be-written data sent by a client until the received to-be-written data forms K data chunks. A size of each data chunk is preset.

Step 208: The storage controller divides each data chunk into two data slices, that is, divides the received to-be-written data into 2*K data slices.

It should be noted that there is no sequence between performing step 202/step 204 and performing step 206/step 208, and step 202/step 204 and step 206/step 208 may be performed in any sequence. Alternatively, step 202/step 204 may be performed when performing step 206/step 208.

Step 210: Encode the 2*K data slices based on the parity matrix selected in step 204, to obtain 2*M parity slices. For a specific encoding process, refer to the foregoing content and the specific embodiment in FIG. 5. The parity matrix selected in step 204 includes 2*M rows, and an XOR equation corresponding to each row is used to obtain one parity slice.

Step 212: Store the obtained 2*K data slices and the 2*M parity slices in K+M different storage devices, and record storage information of each slice. Each storage device stores two data slices that belong to a same data chunk, or stores two parity slices that belong to a same parity chunk. Generally, different chunks are stored in different storage devices. The storage information of each slice includes an identifier (ID) of a storage device in which the slice is located, a storage address, or other information used to access the slice.

After a period of time, after step 202 to step 212 are performed for a plurality of times, a storage system stores a plurality of chunk groups, and the storage controller needs to store an ID of a storage device in which each chunk in each chunk group is located.

For the chunk group, an encoding method corresponds to a reconstruction method. Therefore, reconstruction overheads of a chunk group constructed using the foregoing encoding method are smaller when a damaged chunk is subsequently reconstructed. In addition, because each chunk is divided into only two slices, compared with other approaches in which each chunk is divided into more slices for encoding, when a chunk group constructed using the encoding method provided in this application subsequently reconstructs a damaged chunk, the storage controller needs to execute fewer IO requests. The reconstruction process occupies fewer computing resources of the storage controller, and other services run on the storage controller are less affected.

Figure 7:
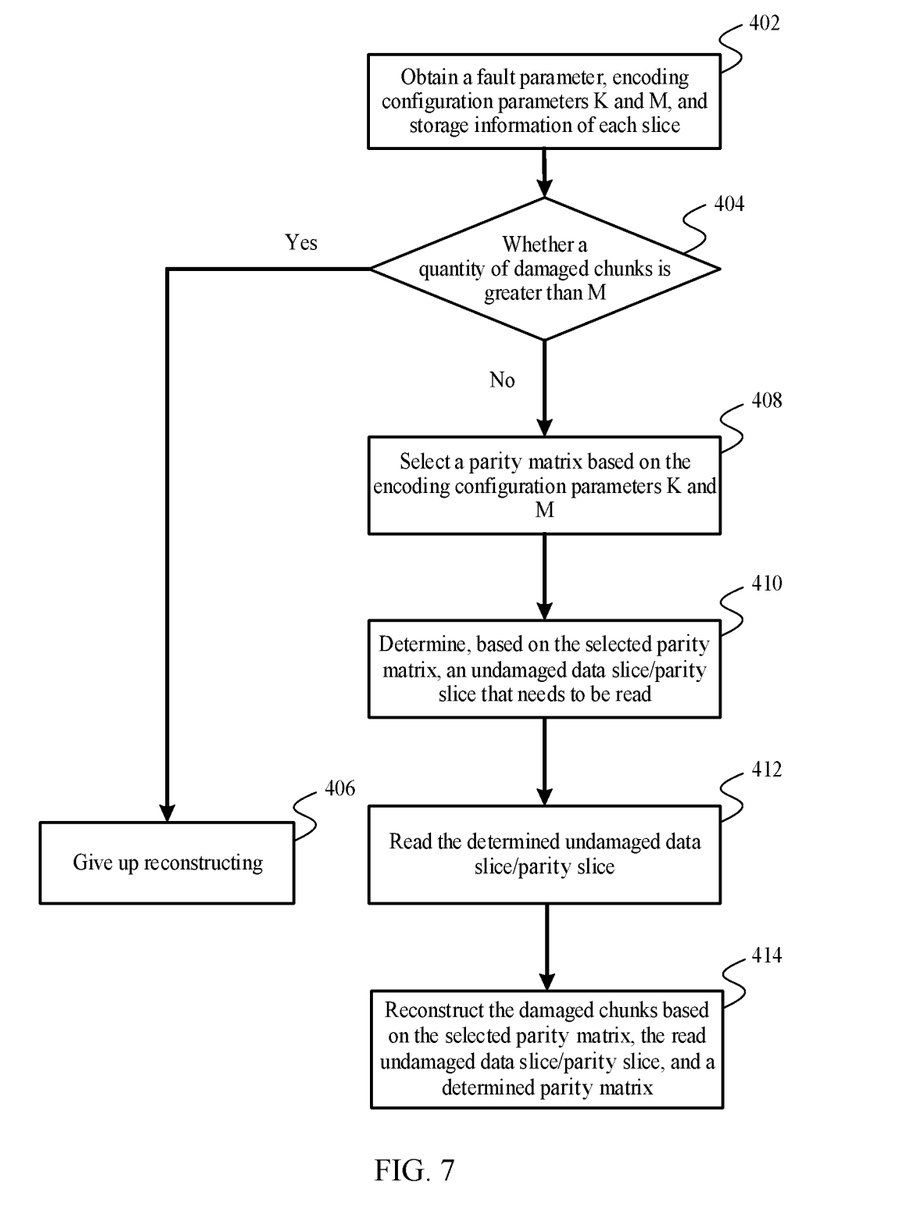
FIG. 7 is a schematic flowchart of a reconstruction method according to an embodiment of this application.

The following describes, using FIG. 7, a reconstruction method performed by a storage controller based on a parity matrix provided in this application.

Step 402: The storage controller obtains a fault parameter r, where the fault parameter r is a quantity of damaged storage devices. Because each storage device stores one chunk in one chunk group, r also represents a quantity of damaged chunks. The storage controller further needs to obtain encoding configuration parameters K and M and storage information of each slice in a damaged chunk group.

Step 404: The storage controller determines whether the fault parameter r is greater than M. When the encoding configuration parameters K and M are used, the storage controller supports chunk reconstruction when a maximum quantity of damaged chunks is M. Therefore, when a quantity of damaged chunks is greater than M, the storage controller performs step 406. When the quantity of damaged chunks is not greater than M, the storage controller performs step 408 to step 414.

Step 406: The storage controller gives up reconstructing the chunk stored in the damaged storage device.

Step 408: The storage controller selects a corresponding parity matrix based on the encoding configuration parameters K and M. The storage controller stores parity matrices corresponding to different encoding configuration parameters, and selects a corresponding parity matrix based on K and M obtained in step 402 for a subsequent reconstruction process.

Step 410: The storage controller determines, based on the selected parity matrix, an undamaged data slice/parity slice that needs to be read.

An undamaged data slice and/or parity slice that are/is required for reconstructing the damaged chunk may be determined based on the selected parity matrix. Each parity slice participates in only one XOR equation. Therefore, if the damaged chunk is a parity chunk, there is only one manner of reconstructing the parity slice, and only a data slice needs to participate in reconstructing the parity slice (similar to re-executing an encoding procedure). Reconstruction of a data slice requires participation of a data slice and a parity slice. Because each data slice participates in a plurality of XOR equations, if the damaged chunk is a data chunk, there are a plurality of data slice reconstruction manners. In addition, reconstruction overheads of the plurality of data slice reconstruction manners may be different. Therefore, the storage controller may store a reconstruction manner with reconstruction overheads that are optimal when each data chunk is damaged, that is, the storage controller stores XOR equations that correspond to two rows of the parity matrix and that are used by each damaged data chunk, to reconstruct the damaged data chunk.

Step 412: The storage controller reads the undamaged data slice/parity slice from the storage device based on storage information of the determined undamaged data slice/parity slice.

Step 414: The storage controller reconstructs the damaged chunk based on the selected parity matrix, the read undamaged data slice/parity slice, and a determined parity matrix. The storage controller stores the reconstructed chunk into another undamaged storage device, and updates an ID of a storage device in which each chunk in a chunk group, in which the reconstructed chunk is located, is located.

In the foregoing reconstruction manner, reconstruction overheads are smaller when the damaged chunk is reconstructed. In addition, because each chunk is divided into only two slices, compared with other approaches in which each chunk is divided into more slices, when a chunk group constructed using the reconstruction method subsequently reconstructs a damaged chunk, the storage controller needs to execute fewer IO requests, the reconstruction process occupies fewer computing resources of the storage controller, and other services run on the storage controller are less affected.

Figure 8:
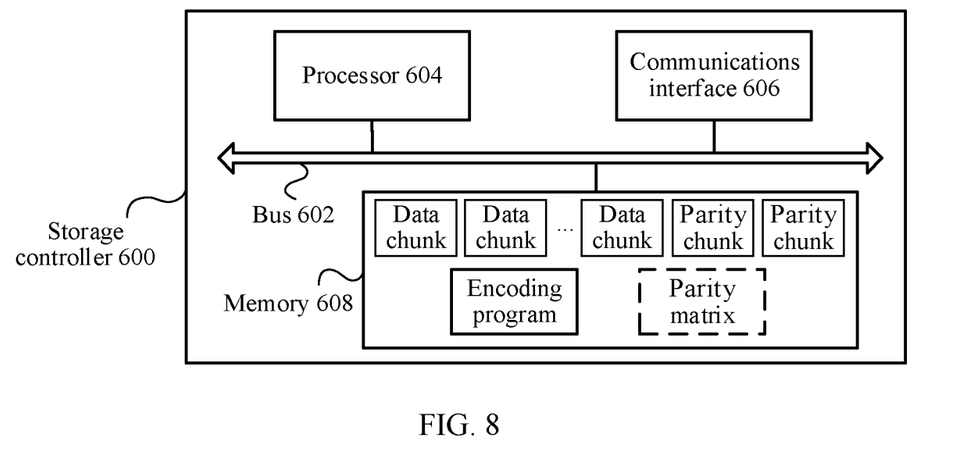
FIG. 8 is a schematic diagram of an organizational structure of a storage controller according to an embodiment of this application.

FIG. 8 provides a storage controller 600. The storage controller 600 may be applied to the storage system shown in FIG. 1 or FIG. 2. The storage controller 600 includes a processor 604, a memory 608, and a communications interface 606. Optionally, the storage controller 600 further includes a bus 602. The processor 604, the memory 608, and the communications interface 606 communicate with each other using the bus 602.

The processor 604 may be a central processing unit (CPU). The memory 608 may include a volatile memory, for example, a RAM. The memory 608 may further include a non-volatile memory, for example, a ROM, a flash memory, an HDD, or an SSD.

The communications interface 606 includes a network interface and a storage device read/write interface, which are respectively configured to obtain to-be-written data sent by a client and write each slice obtained by encoding into a storage device. The network interface and the storage device read/write interface may also be implemented using one interface.

The storage controller 600 provided in FIG. 8 is in an encoding process. Therefore, the memory 608 stores an encoding program and K data chunks. When the storage controller 600 runs, the processor 604 reads the encoding program and the K data chunks from the memory 608, to perform the encoding method described in FIG. 6 to generate a parity chunk, and stores chunks in the chunk group into different storage devices using the communications interface 606.

Figure 9:
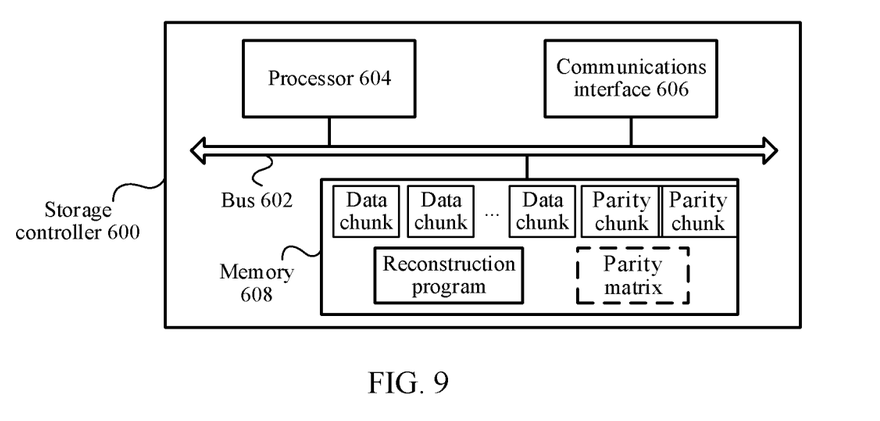
FIG. 9 is a schematic diagram of an organizational structure of another storage controller according to an embodiment of this application.

The storage controller provided in FIG. 9 and the storage controller provided in FIG. 8 are a same storage controller. However, the storage controller 600 provided in FIG. 9 is in a reconstruction process. When a storage device in a storage system in which the storage controller 600 is located is damaged, the processor 604 reads, from the memory 608, a reconstruction program and a chunk required for restoring the damaged storage device, to perform the reconstruction method described in FIG. 7 to restore a chunk stored in the damaged storage medium. The foregoing encoding program and the reconstruction program may also be combined into one program.

A parity matrix may be stored in the memory 608 in a plurality of manners, for example, the parity matrix may be stored in a form of a matrix, or may be stored in the memory 608 in a form of 2*M XOR equations.

Figure 10:
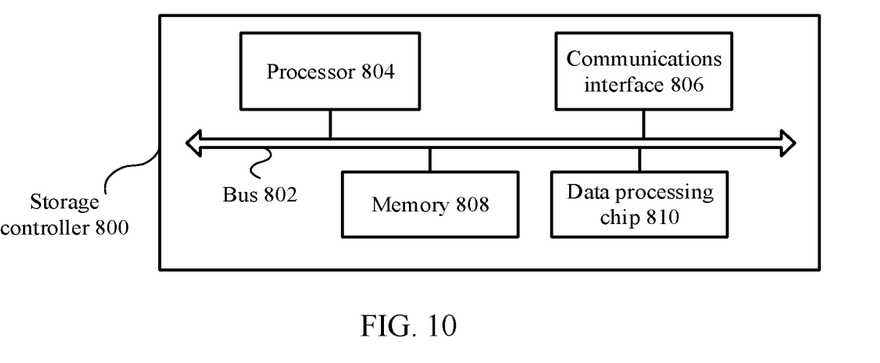
FIG. 10 is a schematic diagram of an organizational structure of another storage controller according to an embodiment of this application.

FIG. 10 provides another storage controller 800. The storage controller 800 may be applied to the storage system shown in FIG. 1 or FIG. 2. The storage controller 800 includes a processor 804, a memory 808, a data processing chip 810, and a communications interface 806. Optionally, the storage controller 800 further includes a bus 802. The processor 804, the memory 808, and the communications interface 806 communicate with each other using the bus 802.

The processor 804 may be a CPU. The memory 808 may include a volatile memory. The memory 808 may further include a non-volatile memory.

The communications interface 806 includes a network interface and a storage device read/write interface, which are respectively configured to obtain to-be-written data sent by a client and write each slice obtained by encoding into a storage device. The network interface and the storage device read/write interface may also be implemented using one interface.

The data processing chip 810 may be implemented using a circuit. The circuit may be an application-specific integrated circuit (ASIC) or a programmable logic device (PLD). The foregoing PLD may be a complex PLD (CPLD), a field-programmable gate array (FPGA), generic array logic (GAL), or any combination thereof.

The data processing chip 810 is configured to encode a data slice based on a parity matrix to obtain a parity slice, reconstruct a damaged slice based on the parity matrix, and store the slice obtained by encoding in the memory 808, that is, perform step 202, step 204, parts of obtaining the encoding configuration parameters K and M in step 210 and step 402, step 408, and step 414. The processor 804 is configured to read a program in the memory to perform another step.

Figure 11:
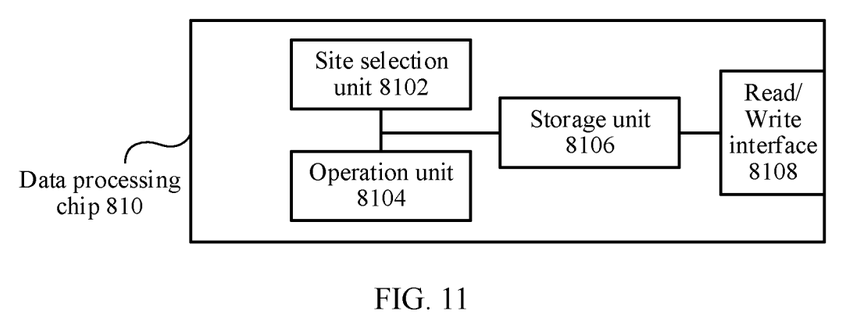
FIG. 11 is a schematic diagram of an organizational structure of a data processing chip according to an embodiment of this application.

As shown in FIG. 11, the data processing chip 810 may include a site selection unit 8102, an operation unit 8104, a storage unit 8106, and a read/write interface 8108. The site selection unit 8102, the operation unit 8104, and the storage unit 8106 may be actually integrated into one circuit.

The read/write interface 8108 is connected to the bus 802, and is configured to, in a scenario in which the data processing chip 810 performs an encoding method, obtain, using the bus 802, a chunk stored in the memory 808, store the chunk in the storage unit 8106, send, using the bus 802, a chunk obtained after encoding to the memory 808, and then obtain a next chunk by encoding. The read/write interface 8108 is further configured to in a scenario in which the data processing chip 810 performs a reconstruction method, obtain, using the bus 802, a chunk required in the reconstruction process, store the chunk in the storage unit 8106, and send a reconstructed chunk to the memory 808.

A function of the site selection unit 8102 is similar to that of a parity matrix. The site selection unit 8102 indicates slices that are in the storage unit 8106 and on which an XOR operation should be performed by the operation unit 8104 in a process of performing the XOR operation such that the operation unit 8104 obtains a corresponding slice from the storage unit 8106 to complete the XOR operation.

The operation unit 8104 obtains, from the storage unit 8106 based on an instruction of the site selection unit 8102, a plurality of slices on which the XOR operation needs to be performed in the process of the XOR operation, stores the obtained slices into the storage unit 8106 after the XOR operation is performed, and then performs a next XOR operation.

Figure 12:
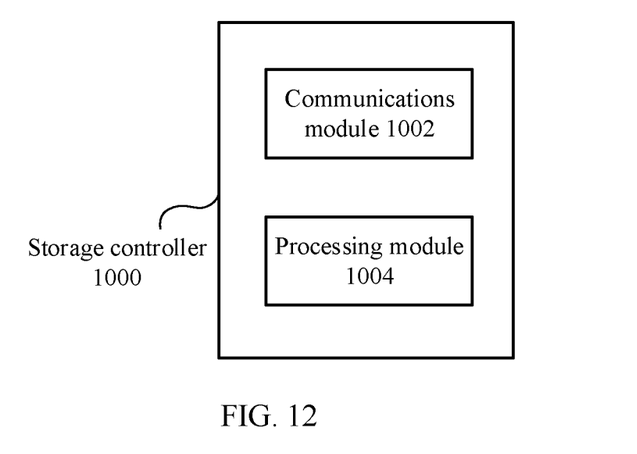
FIG. 12 is a schematic diagram of an organizational structure of another storage controller according to an embodiment of this application.

As shown in FIG. 12, another storage controller 1000 is provided, including a communications module 1002 and a processing module 1004. The communications module 1002 is configured to communicate with a client and a storage device, and the processing module 1004 is configured to perform the methods provided in FIG. 6 and FIG. 7. The communications interfaces in FIG. 8 to FIG. 10 are an implementation of the communications module 1002. The processor 604 and the memory 608 in FIG. 8 and FIG. 9 are an implementation of the processing module 1004. The processor 804, the memory 808, and the data processing chip 810 in FIG. 9 are another implementation of the processing module 1004.

In the foregoing embodiments, the descriptions of each embodiment have a respective focus. For a part that is not described in detail in an embodiment, refer to related descriptions in other embodiments.

The method described in combination with the disclosed content in this application may be implemented in a manner of executing a software instruction by a processor. The software instruction may include a corresponding software module. The software module may be stored in a RAM, a flash memory, a ROM, an erasable programmable ROM (EPROM), an electrically EPROM (EEPROM), an HDD, an SSD, an optical disc, or any other form of storage medium well known in the art.

A person skilled in the art should be aware that in the foregoing one or more examples, functions described in this application may be implemented by hardware or software. When the functions are implemented by software, the foregoing functions may be stored in a computer-readable medium or transmitted as one or more instructions or code in the computer-readable medium. The storage medium may be any available medium accessible to a general-purpose or dedicated computer.

The objectives, technical solutions, and benefits of this application are further described in detail in the foregoing specific embodiments. It should be understood that the foregoing descriptions are merely specific embodiments of this application, but are not intended to limit the protection scope of this application. Any modification or improvement made based on the technical solutions of this application shall fall within the protection scope of this application.

What is claimed is:

1. An erasure code (EC)-based data processing method implemented by a storage controller, wherein the EC-based data processing method comprises:
obtaining K data chunks, wherein K is a positive integer;
dividing each of the K data chunks into two data slices to obtain a total of 2*K data slices;
encoding the 2*K data slices based on a parity matrix to obtain 2*M parity slices, wherein the 2*M parity slices form M parity chunks, wherein M is a positive integer, wherein the parity matrix comprises 2*M rows of elements and 2*(K+M) columns of elements, wherein each column of the 2*(K+M) columns of elements corresponds to one data slice or one parity slice, wherein each row of the 2*M rows of elements corresponds to one exclusive OR (XOR) equation, and wherein the one XOR equation is used to encode one parity slice based on a subset of the 2*K data slices; and
storing the K data chunks and the M parity chunks in a plurality of storage devices, wherein the plurality of storage devices are K+M different storage devices, and wherein each storage device of the K+M different storage devices stores two parity slices of one parity chunk of the M parity chunks or stores two data slices of one data chunk of the K data chunks.

2. The EC-based data processing method of claim 1, wherein the parity matrix is preset in the storage controller.

3. The EC-based data processing method of claim 2, wherein the parity matrix satisfies a setting rule that comprises that an element in the parity matrix is zero, one, or an element in a finite field.

4. The EC-based data processing method of claim 2, wherein the parity matrix satisfies a setting rule that comprises that two columns in the parity matrix that correspond to two data slices comprised in any data chunk or two parity slices comprised in any parity chunk form a first submatrix comprising 2*M rows and two columns of elements, and wherein one of 2*2 matrices formed by any two even-numbered rows or any two odd-numbered rows of the first submatrix is full rank.

5. The EC-based data processing method of claim 2, wherein the parity matrix satisfies a setting rule that comprises that 2*r columns in the parity matrix that correspond to 2*r slices comprised in any r chunks form a second submatrix comprising 2*M rows and 2*r columns of elements, wherein a rank of the second submatrix is 2r, and wherein r is an integer less than or equal to M.

6. The EC-based data processing method of claim 2, further comprising:
determining that r chunks in the K data chunks and the M parity chunks are damaged, wherein r is an integer less than or equal to M; and
reconstructing the r chunks based on XOR equations corresponding to a plurality of rows of elements in the parity matrix.

7. A storage controller comprising:
a memory configured to store a program; and
a processor coupled to the memory and configured to execute the program to cause the storage controller to be configured to:
obtain K data chunks, wherein K is a positive integer;
divide each of the K data chunks into two data slices to obtain a total of 2*K data slices;
encode the 2*K data slices based on a parity matrix to obtain 2*M parity slices, wherein the 2*M parity slices form M parity chunks, wherein M is a positive integer, wherein the parity matrix comprises 2*M rows of elements and 2*(K+M) columns of elements, wherein each column of the 2*(K+M) columns of elements corresponds to one data slice or one parity slice, wherein each row of the 2*M rows of elements corresponds to one exclusive OR (XOR) equation, and wherein the one XOR equation is used to encode one parity slice based on a subset of the 2*K data slices; and
store the K data chunks and the M parity chunks in a plurality of storage devices, wherein the plurality of storage devices are K+M different storage devices, and wherein each storage device of the K+M different storage devices stores two parity slices of one parity chunk of the M parity chunks or stores two data slices of one data chunk of the K data chunks.

8. The storage controller of claim 7, wherein the parity matrix is preset in the storage controller.

9. The storage controller of claim 8, wherein the parity matrix satisfies a setting rule that comprises that an element in the parity matrix is zero, one, or an element in a finite field.

10. The storage controller of claim 8, wherein the parity matrix satisfies a setting rule that comprises that two columns in the parity matrix that correspond to two data slices comprised in any data chunk or two parity slices comprised in any parity chunk form a first submatrix comprising 2*M rows and two columns of elements, and wherein one of 2*2 matrices formed by any two even-numbered rows or any two odd-numbered rows of the first submatrix is full rank.

11. The storage controller of claim 8, wherein the parity matrix satisfies a setting rule that comprises that 2*r columns in the parity matrix that correspond to 2*r slices comprised in any r chunks form a second submatrix comprising 2*M rows and 2*r columns of elements, wherein a rank of the second submatrix is 2r, and wherein r is an integer less than or equal to M.

12. The storage controller of claim 8, wherein the processor is further configured to execute the program to cause the storage controller to be configured to:
   determine that r chunks in the K data chunks and the M parity chunks are damaged, wherein r is an integer less than or equal to M; and
   reconstruct the r chunks based on XOR equations corresponding to a plurality of rows of elements in the parity matrix.

13. A computer program product comprising computer-executable instructions for storage on a non-transitory computer-readable storage medium that, when executed by a processor, cause a storage controller to:
   obtain K data chunks, wherein K is a positive integer;
   divide each of the K data chunks into two data slices to obtain a total of 2*K data slices;
   encode the 2*K data slices based on a parity matrix to obtain 2*M parity slices, wherein the 2*M parity slices form M parity chunks, wherein M is a positive integer, wherein the parity matrix comprises 2*M rows of elements and 2*(K+M) columns of elements, wherein each column of the 2*(K+M) columns of elements corresponds to one data slice or one parity slice, wherein each row of the 2*M rows of elements corresponds to one exclusive OR (XOR) equation, and wherein the one XOR equation is used to encode one parity slice based on a subset of the 2*K data slices; and
   store the K data chunks and the M parity chunks in a plurality of storage devices, wherein the plurality of storage devices are K+M different storage devices, and wherein each storage device of the K+M different storage devices stores two parity slices of one parity chunk of the M parity chunks or stores two data slices of one data chunk of the K data chunks.

14. The computer program product of claim 13, wherein the parity matrix is preset in the storage controller.

15. The computer program product of claim 14, wherein the parity matrix satisfies a setting rule that comprises that an element in the parity matrix is zero.

16. The computer program product of claim 14, wherein the parity matrix satisfies a setting rule that comprises that an element in the parity matrix is one.

17. The computer program product of claim 14, wherein the parity matrix satisfies a setting rule that comprises that an element in the parity matrix is an element in a finite field.

18. The computer program product of claim 14, wherein the parity matrix satisfies a setting rule that comprises that two columns in the parity matrix that correspond to two data slices comprised in any data chunk or two parity slices comprised in any parity chunk form a first submatrix comprising 2*M rows and two columns of elements, and wherein one of 2*2 matrices formed by any two even-numbered rows or any two odd-numbered rows of the first submatrix is full rank.

19. The computer program product of claim 14, wherein the parity matrix satisfies a setting rule that comprises that 2*r columns in the parity matrix that correspond to 2*r slices comprised in any r chunks form a second submatrix comprising 2*M rows and 2*r columns of elements, wherein a rank of the second submatrix is 2r, and wherein r is an integer less than or equal to M.

20. The computer program product of claim 14, wherein the computer-executable instructions further cause the storage controller to:
   determine that r chunks in the K data chunks and the M parity chunks are damaged, wherein r is an integer less than or equal to M; and
   reconstruct the r chunks based on XOR equations corresponding to a plurality of rows of elements in the parity matrix.

* * * * *